(12) United States Patent
Kosmahl

(10) Patent No.: US 6,356,023 B1
(45) Date of Patent: *Mar. 12, 2002

(54) TRAVELING WAVE TUBE AMPLIFIER WITH REDUCED SEVER

(75) Inventor: Henry G. Kosmahl, Westlake, OH (US)

(73) Assignee: AmpWave Tech, LLC, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/704,331

(22) Filed: Nov. 1, 2000

Related U.S. Application Data

(63) Continuation of application No. 09/612,035, filed on Jul. 7, 2000.

(51) Int. Cl.[7] .............................................. H01J 25/34
(52) U.S. Cl. ........................................ 315/3.5; 315/3.6
(58) Field of Search ..................... 315/3.5, 3.6, 5.38, 315/5; 330/43

(56) References Cited

U.S. PATENT DOCUMENTS

| | | | | |
|---|---|---|---|---|
| 3,735,188 A | * | 5/1973 | Anderson et al. | 315/3.5 |
| 3,761,760 A | | 9/1973 | Harper et al. | 315/3.6 |
| 3,781,588 A | | 12/1973 | Winslow | 315/3.5 |
| 4,178,533 A | * | 12/1979 | Ribout et al. | 315/3.5 |
| 4,296,354 A | | 10/1981 | Neubauer | 315/3.5 |
| 4,378,512 A | * | 3/1983 | Tsutaki | 315/3.6 |
| 4,481,444 A | | 11/1984 | Phillips | 315/3.6 |
| 4,559,474 A | | 12/1985 | Duret et al. | 315/3.6 |
| 4,564,787 A | | 1/1986 | Kosmahl | 315/3.6 |
| 4,572,985 A | * | 2/1986 | Kuntzmann et al. | 315/3.5 |
| 5,384,951 A | * | 1/1995 | Karsten, Jr. et al. | 29/600 |
| 5,501,390 A | | 3/1996 | Allen et al. | 228/124.1 |
| 5,723,948 A | | 3/1998 | Yoshida | 315/3.6 |
| 5,834,971 A | | 11/1998 | Giguere et al. | 330/43 |
| 5,959,406 A | | 9/1999 | Hart et al. | 315/3.5 |
| 6,044,001 A | | 3/2000 | Lee | 363/97 |
| 6,049,249 A | * | 4/2000 | Tammaru et al. | 330/43 |
| 6,111,358 A | | 8/2000 | Cardwell et al. | 315/3.5 |

OTHER PUBLICATIONS

Electronics Engineers' Handbook; Fourth Edition; Donald Christiansen; pp. 12.43–12.51 and 17.120–17.121.
Slow–Wave Structures In Microwave Tubes; B. Epstein; Thomson–CSF Electron Tube Division; France; pp. 18.1 IEDM 84 486—489; 1984.
Advanced Communication Traveling Wave Tubes for Space Applications; Gordon A. Lange, Electron Dynamics Division, Hughes Aircraft Company; Presented to Communications Satellite Conference in 1986.

* cited by examiner

Primary Examiner—Don Wong
Assistant Examiner—Ephrem Alemu
(74) Attorney, Agent, or Firm—Brinks Hofer Gilson & Lione

(57) ABSTRACT

A structure to eliminate non-fundamental space harmonics in helical traveling wave tubes is disclosed. A sever of moderate attenuation is produced by way of a conductive surface on nonconductive rods supporting a helical conductor in a traveling wave tube. In addition, the radius and pitch of the helical conductor are simultaneously varied over a short distance to improve the efficiency and performance of the tube.

37 Claims, 4 Drawing Sheets

COMPUTED POWER TRANSFER CHARACTERISTICS
FOR TRAVELING WAVE TUBE AMPIFIERS

INPUT END

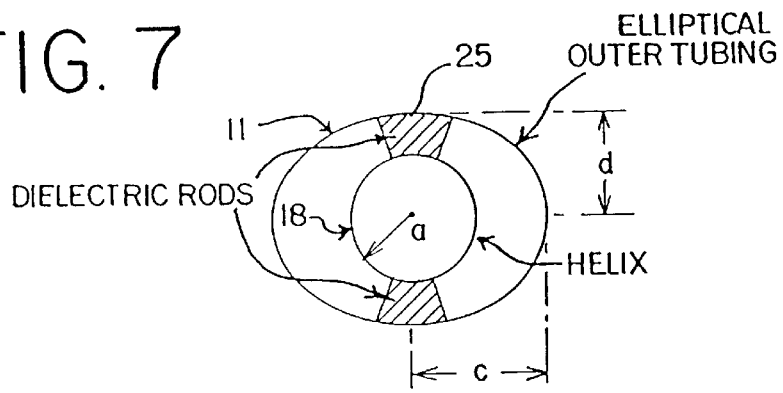
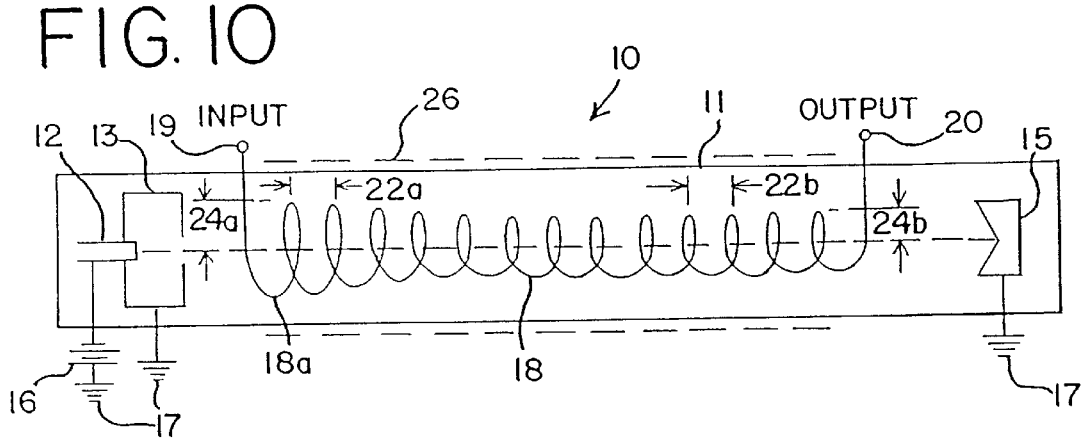
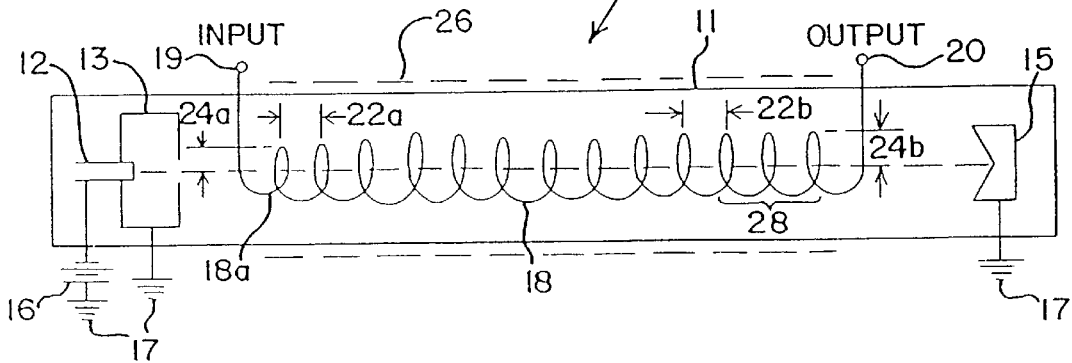

TRAVELING WAVE TUBE AMPLIFIER WITH REDUCED SEVER

RELATED APPLICATION

This application is a continuation in part of application Ser. No. 09/612,035, filed Jul. 7, 2000.

FIELD OF THE INVENTION

This invention relates to helical traveling wave tube amplifiers, useful in amplifying RF signals in communications, data transmission, broadcasting, satellite and radar mapping applications. A novel geometry and sever eliminates destructive interference within the amplifier, and results in significantly improved efficiency.

BACKGROUND

A traveling wave tube (TWT) is a device used to amplify an RF signal in a high vacuum environment. The RF signal is amplified by the interaction of the RF wave with a beam of electrons at high voltage. The electrons are emitted from an electron gun, a thermionic emitter of electrons, using a heater to achieve required temperatures, up to 1000° C. or more. The RF signal is typically in the range of 500 MHz to 50 GHz. A traveling wave tube used to accomplish this amplification may be of either the close-coupled cavity type or the helical type. The helical type has been favored because of its simpler construction, lower cost and large band width. Both types of amplifier, however, suffer low electronic efficiency. Other disadvantages follow from high skin effect losses, resulting in part from high helix temperatures. This typically translates into a need for greater heat transfer. High temperatures also create higher $I^2R$ losses in the helix itself, due to the simple fact that electrical resistance increases with temperature. These disadvantages also limit the performance of the amplifier, and require more amplifiers be used if fewer amplifiers cannot meet the needs of the application.

The need for improvement in helical tubes has been recognized and many suggestions have been made over the years. Instead of ordinary helical sections, shaped conical sections have been proposed. Varying and reducing the pitch between repeating elements of the helix have been suggested. One improvement by the inventor of the present invention, U.S. Pat. No. 4,564,787, and incorporated here by reference, involved a dynamic velocity taper, varying the pitch of the helix at an exponential rate, while keeping the helix radius constant.

When the gain of an amplifier exceeds about 20 dB, there may be backward wave oscillations of the RF signals input into the amplifier. These backward oscillations render the amplifier less useful. In addition to these undesirable oscillations, unacceptable fluctuations in amplifier gain and phase may be caused by inaccuracies in the construction of the amplifier. Fluctuations may also be caused by reflections from mismatches in the output load or terminations. One way to improve the efficiency of traveling wave tubes is to use a sever. A sever is a conductive path between the helical conductor of a traveling wave tube and the housing which is typically made of metal. A sever functions as a form of filter, helping prevent such backward oscillations and helping to smooth out fluctuations in the amplifier gain. The sever is intended to reduce backward waves on the helix without interfering with the "bunching" or slowing of electrons in the electron beam. However, even a good conventional sever may reduce the bunching, represented by the amplitude of RF current in the beam, by about 15%. This contributes directly to a loss of efficiency in the amplifier.

A sever in a traveling wave tube consists of a short region, typically 1 cm. to about 5 cm. long, depending on the frequency of operation. The sever consists of a conductive material deposited on the dielectric rods used to support a helical conductor in a housing. When the gain of the amplifier approaches about 20–25 dB, a sever is placed at an input end of the helical conductor to produce a gradual, exponentially increasing electrical contact. The sever reduces signals by about 50–60 dB in the middle of the sever. Then the sever begins an exponentially decreasing contact, down to a level of no attenuation at the opposite end of the sever, on the side toward the output end of the helical conductor.

Severs have two disadvantages. They reduce electronic efficiency by about 2%, which translates into an even greater loss in overall efficiency in the amplifier as a whole. They also add approximately 2 to 5 cm in length to the helical conductor, as the amplifier is lengthened to make up for the electrical loss. Overall, such severs add about 20% to the length and weight of each amplifier, and can reduce efficiency by approximately 20%.

What is needed is a construction that will prevent backward oscillations of RF waves and prevent fluctuations in the amplifier gain. What is needed is a sever that can prevent backward oscillations without debunching of electrons and loss of this efficiency in the amplifier. What is needed is a sever without the undesirable properties of present severs.

BRIEF SUMMARY

A key to increasing efficiency in the traveling wave tube amplifier by means of a sever is to limit the attenuation of the sever. Rather than providing a high degree of attenuation, it has been found that an increase in efficiency may be attained by a lower degree of attenuation.

One aspect of the invention is a helical traveling wave tube amplifier for amplifying an RF signal. The amplifier includes a traveling wave tube with an anode, a cathode and a collector. A negative potential is applied to the cathode, inducing a beam of electrons to the anode, which is typically at ground potential. The beam passes through to the collector. The beam of electrons amplifies an RF signal input to a helical conductor. The helical conductor includes an RF input, an input section, a middle section, an output section, and an RF output. The input section of the helical conductor includes an adverse space harmonics taper.

The amplifier is constructed so that helical conductor is between the cathode and the collector, and the beam of electrons travels through the center of the helical conductor. The traveling tube amplifier and the helical conductor are enclosed in a housing, and are operated at high vacuum. At least one dielectric rod provides support for the helical conductor inside the housing. A sever is constructed between the helical conductor and the housing, by providing a conductive coating on the dielectric rods. The sever desirably provides about 1 to about 30 dB of attenuation, as portions of the RF signal, and desirably any backward oscillations, are bled off.

Another key to the invention is to recognize the importance of the interaction between the electron beam and the RF signal. The reason that traveling wave tube amplifiers are sometimes called "slow wave structures" is that the RF signal is traveling much faster than the generated electron beam, and the RF signal must be slowed down for interaction with, and amplification by, the electron beam. The formation of a helical path is the first step in the slowing process and is recognized as a means of lengthening the path. In one embodiment of the invention, the sever is used with a conductor having a helical path of varying radius, in conjunction with a simultaneously varying pitch, forming an adverse space harmonics taper (ASHT) in part of the helix. Adverse space harmonic tapers have been described in co-pending U.S. pat. application Ser. No. 09/612,035, assigned to the assignee of the present application. It has been discovered that such a structure is capable of achieving far greater interaction between the RF signal and the electron beam, and thus achieving greater electronic efficiency in the amplification, and greater efficiency overall in the performance of a traveling wave tube. The use of the ASHT and the improved sever lead to an overall increase in efficiency of about 10% or more.

One embodiment of the invention is a helical traveling wave tube, which includes a helical conductor with an RF input and an RF output, and an electron gun positioned concentrically with respect to the helical conductor. The electron gun consists of a negatively-biased cathode and a grounded anode, both at a near end of the helical conductor. There may also be a control grid downstream of the anode, still at the near end, and a collector at the far end of the helical conductor. The electron gun may be run in a DC mode or may be pulsed as desired through the cathode or the grid. A series of magnets surrounds the outside of the helical tube, for a magnetic field to focus the beam of electrons passing from the cathode to the collector. At least the portion of the apparatus comprising the electron gun, the helical conductor, and the RF input and output should be operated in a hard vacuum.

The helical conductor has an input section corresponding to an RF input and an output section corresponding to an RF output. In a preferred embodiment, a portion of the helical conductor contacts a portion of the support structure between the helical conductor and the housing. The support structure includes at least one dielectric rod between the helical conductor and the housing, and a sever is located near at least one point of contact. The sever desirably provides about 1 to about 30 dB of attenuation of an RF signal input to the helical conductor, and eliminates backward oscillations of the RF waves.

BRIEF DESCRIPTION OF SEVERAL VIEWS OF THE DRAWINGS

FIG. 7 is a cross section of a helical traveling wave tube according to the present invention.

FIG. 10 is a side view of a helical traveling wave tube with a decreasing adverse harmonics space taper according to the present invention.

FIG. 11 is a side view of a helical traveling wave tube with an increasing adverse space harmonics taper according to the present invention, and a dynamic velocity taper.

DETAILED DESCRIPTION OF THE INVENTION

Figure 1:
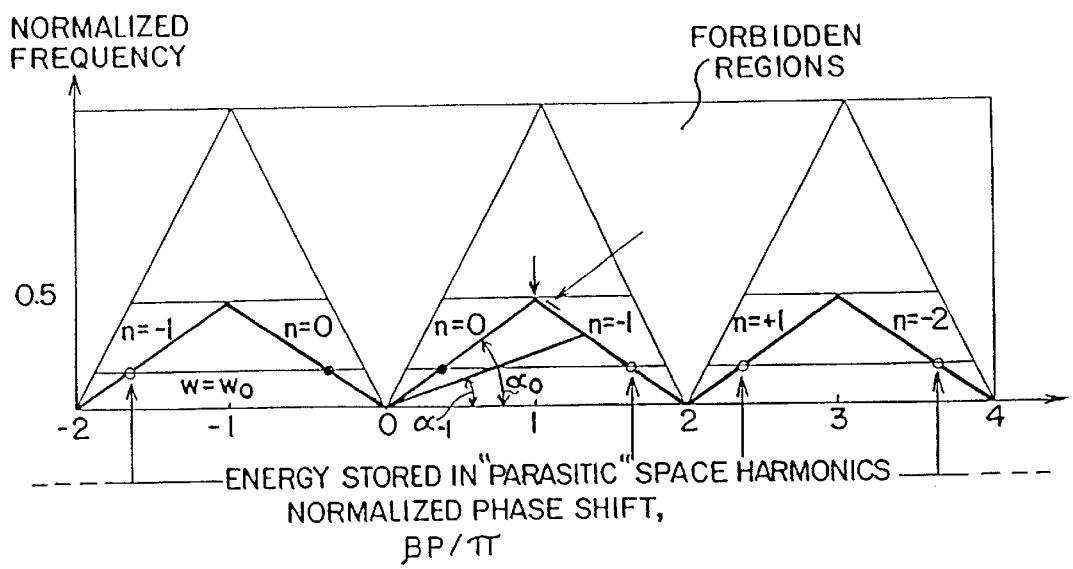
FIG. 1 is a modified Brillouin diagram.

Traveling wave tubes are used to amplify RF signals in a variety of applications. One very significant application of such tubes is in satellites, where traveling wave tubes are used for communications, data processing, broadcasting, mapping, and similar applications. The growing volume in all satellite applications now demands an increase in efficiency or an increase in the number of satellites. Increasing the efficiency of traveling wave tubes would thus result in lower cost (fewer satellites) as well as better performance. Improvements have been made to traveling wave tubes since they were first introduced in 1945, but a central problem remains: electronic efficiency, $\eta_e$, the interaction between a very low intensity RF signal and an electron beam, continues to be only between 10 and 25%.

A reduced sever, providing less of a conductive path between the helical conductor and another metal object (the housing), has a higher impedance, and a lower conductivity. This improved sever is desirably used in conjunction with an improved helical conductor, having an adverse space harmonics taper (ASHT). This is because an ASHT helps to eliminate backward oscillations and reduces the need for a sever. The ASHT is desirably placed adjacent an input section of the helical conductor, while the sever is placed downstream of the ASHT, that is, toward the output section of the amplifier. In another preferred embodiment, a dynamic velocity taper, in which the helical conductor has a constant radius and an exponentially varying pitch, may be placed near the output section of the helical conductor. A dynamic velocity taper is desirably used to maintain the linearity of gain in the amplifier, and to maintain the phase relationship between the RF signal and the electron beam amplifier, so as to achieve much higher electronic efficiency.

In order to achieve interaction between the RF signal and its electron beam amplifier, the two must approach each other in velocity. The present invention retains many of the advantages of the basic helical structure of the traveling wave tube. The RF signal, traveling at close to the speed of light, must be slowed down to match the electron beam, traveling at about 10 to 50% of the speed of light. With a helix, the RF signal travels along the helix, roughly approximating a circular path, while the electron beam need travel only one pitch of the helix, a much shorter path. Many efforts have been expended over the past 55 years to achieve incremental gains in efficiency. The present invention, however, achieves a greater gain and efficiency as a result of examining fundamental aspects of a basic component of traveling wave tubes, a sever. The invention improves the sever and its interaction with other components in the amplifier to achieve significantly greater electronic efficiency.

The requirement for amplifying signals of radio frequency in the tube is virtual synchronicity between the velocity of the electron beam, $u_0$, and that of the slow wave on the helix, $v_0$. In practical terms, they must be traveling within a few percent of the same speed. The "slow wave" on the helix moves with velocity $v_0$. It is useful to express this velocity by a propagation constant $\beta_0 = \omega_0/v_0$, where $\omega$ is the angular frequency of the RF signal. Under these circumstances, the wave propagates along the length of the helix. Its velocity is $v_0 = c_0 p/2\pi a$, where $c_0$ is the speed of light, a is the radius of the helix, and p is the pitch of the helix. In one embodiment using an improved sever, the helix is wound with a variable pitch p(z), which varies in the direction of propagation along the helix, the z axis, while simultaneously varying the radius a(z) of the helix, which also varies as a function its propagation along the z axis, such that $$\frac{p(z)}{a(z)} = \frac{p_0}{a_0},$$

where $p_0$ and $a_0$ are the pitch and radius of the helix main body.

Under these conditions, the velocity $v_0$ does not vary over the frequency range for the length of the ASHT section. In particular, the propagation constant $\beta_0$ is constant for the fundamental mode and $\beta_0$ is invariant along the length of the helix. However, for all the other harmonics with phase velocities $v_n$ (n ≠0), the propagation constants $\beta_n$ are equal to $\omega_0/v_n$. The propagation constants $\beta_n$ are very strongly affected, where $\beta_n=\beta_0+2\pi n/p$. This includes the principal backward wave harmonic, where n=−1. It can also be seen that the pitch/taper relationship is a simple linear one, and it will be recognized that there are an infinity of solutions that will satisfy the requirements for simultaneously varying both the pitch and the radius of the helical conductor.

When an RF signal is introduced into the helix at a frequency $w\omega_n$, an RF magnetic field is established inside and outside the helix. Using a cylindrical coordinate system with r, Θ, and z, corresponding RF magnetic and electrical fields are also established according to Maxwell's equations, summarized respectively as curl $$H = \varepsilon \frac{\partial E}{\partial t} + j$$

and curl $$E = -\mu_0 \frac{\partial H}{\partial t},$$

where $\in$ is the dielectric constant, j is the current density into the helix, and $\mu_0$ is the permeability of the dielectric material.

The basic requirement is that the tangential components of E and H just inside and just outside the helix radius a are continuous, that is $$E_z^i=E_z^o, \ E_\Theta^i=E_\Theta^o, \ H_z^i=H_z^o, \text{ and } H_\Theta^o=H_\Theta^o,$$

where i and o designate inside and outside, respectively. An unconditional mathematical consequence of this requirement is that the established propagating wave at frequency $\omega_0$ is composed of an infinite set of space harmonics with propagation constants $\beta_n=\omega_0/v_n$, all having the same group velocity $g_0$, but different phase velocities $v_n$, such that $\beta_n=\beta_0+2\pi n/p$, where n are integers from −∞ to +∞, and $\beta_0=\omega_0/v_0$ is the propagation constant for the fundamental wave. Thus, the largest and most important components for the RF field $E_z(r, \Theta, z)$ and $H_z(r, \Theta, z)$ may be written as $$\begin{Bmatrix} E_z(r, \Theta, z) \\ H_z(r, \Theta, z) \end{Bmatrix} = e^{-i\beta_0 z} \left\{ \sum_{n=-\infty}^{n=+\infty} \begin{matrix} An \\ Bn \end{matrix} \right\} e^{-i2\pi nz/p} I_n(y_n r) e^{in\Theta}$$

where $I_n$ is the modified Bessel function of argument $(y_n r)$, and $y_n=(\beta_n^2-k^2)^{0.5}$, where $\beta_n$ is the propagation constant of the nth mode, and k is the free wave propagation constant. The point here is that energy input into the traveling wave tube amplifier is necessarily deposited in these harmonics, rather than completely directed to the desired fundamental wave, which will next be quantified.

The situation is depicted in FIG. 1, a Brillouin or normalized ω-β diagram for the helix. The normalized frequency is plotted against the normalized phase shift for all modes. The branches designated as n=0, ±1, ±2, . . . describe the presence of space harmonics for the fundamental frequency $\omega_0$. The intersection of the line $\omega_0$ with the ±n branches indicate that in order to excite the desired n=0 fundamental space harmonic, it is inevitable that all other space harmonics are excited and that energy is undesirably stored in them. The amount of this undesirable energy, $W_n$, is approximately equal to the "useful" desirable energy available for amplification of the RF signal, $W_0$. Eliminating or reducing these modes can be achieved by optimizing the location and shape of an adverse space harmonics taper in the input section of a helical traveling wave tube.

The stored electrical energy per period is equal to $$W = \frac{\varepsilon}{2} \sum_{n=0}^{\infty} E_n^2 = \frac{\varepsilon}{2}\left(E_0^2 + \sum_{n\neq 0} E_n^2\right) = W_0 + W_n$$

where $E_0$ is the longitudinal electric field magnitude of the fundamental space harmonic, $E_n$ is the longitudinal electric field magnitude of the n-th order space harmonic, and where $W_0$ is approximately equal to $W_n$. The adverse space harmonics taper of this invention reduces all electric field components for which n≠0. The energy previously stored in modes $W_n$ is thereby available for enhancement of the fundamental, $W_0$. If the energy previously "wasted" is approximately equal to the useful energy, then there is potential for almost doubling the useful electric field strength of an amplifier.

Another way to make this point is that the electric field of the tube for the fundamental wave could be doubled with a beneficial effect. The impedance of the fundamental, $K_0$, is equal to $E_0^2/(2\beta_0^2 * v_g * W_0/L)$, where $E_0$ is the longitudinal electric field magnitude as defined above, $\beta_0$ is the propagation constant for the fundamental mode, $v_g$ is the group velocity for all space harmonics of the system, and $W_0/L$ is the energy available per period of the helix to the fundamental mode. In order to accomplish this doubling, the electric field magnitude for the fundamental harmonic, $E_0$, should be optimized. With state-of-the art tubes yielding at best about 25% electronic efficiency, the amplifier could thus approach 30% electronic efficiency, $\eta_e$, in amplifying an RF signal. The gain in such a system would be measurable in one way by comparing the electric fields available, and minimizing the energy available to non-fundamental space modes.

The advantage of the adverse space harmonics taper may be understood in two ways. One aspect of the ASHT, as noted above, is that the fundamental phase velocity $v_0$ remains constant, invariant to frequency and distance changes for the forward wave but producing substantial destructive effects on all other space harmonics. In other words, the undesirable backward wave oscillations (BWO) are suppressed. In particular, it was hypothesized that the phase velocity of the first backward space harmonic was given by the equation $$\frac{c_0}{v_{-1}} = \frac{\lambda}{p} - \frac{2\pi a}{p} \qquad (Eq. 1)$$

where $c_0$ is the speed of light, $v_{-1}$ is the velocity of the first backward harmonic, $\lambda$ is the free space wavelength, p is the pitch of the helix and a is the radius of the helix.

This equation may also be written in terms of the angular frequency $\omega$, $$\omega = c_0/a - (pc_0/2\pi a) \cdot \beta_{-1} \qquad (Eq. 2)$$

where $\beta_{-1} = \omega/v_{-1}$. It is clear that the first term on the right in Eq. 1 will vary continuously with wavelength (or frequency) as well as the pitch of the helix. An oscillation $\omega_{osc}$, whose frequency equals $c_0/2a$, at the $\pi$ point, will also vary continuously. Thus, it is seen that while amplification takes place relatively smoothly, the phase velocity of the harmonics varies continuously. Performance could possibly be improved by using this influence on backwardwave oscillations near the $\pi$-point to eliminate the interference and achieve greater positive amplification of the fundamental frequency. The second term suggests a structure whose pitch and radius vary simultaneously. Most traveling wave tube amplifiers operate at frequencies from 0.5 to 50 GHz, with designs well below the $\pi$-point.

It is important to understand that it is a relatively small change in the helix and the sever that produce a profound effect in the amplifier. The improved amplifier can best be understood by understanding that the RF current fed into the helix contains all fundamental and all space harmonic components of the current. In passing through the ASHT, only the space harmonics experience an adverse phase shift that inhibits their interaction with the electron beam throughout the helical conductor, as the current traverses the helix. As noted above, the forward wave is amplified, but the backward wave oscillations are suppressed. Therefore the sever and its effect can be reduced, and the efficiency of the amplifier improved.

Figure 2:
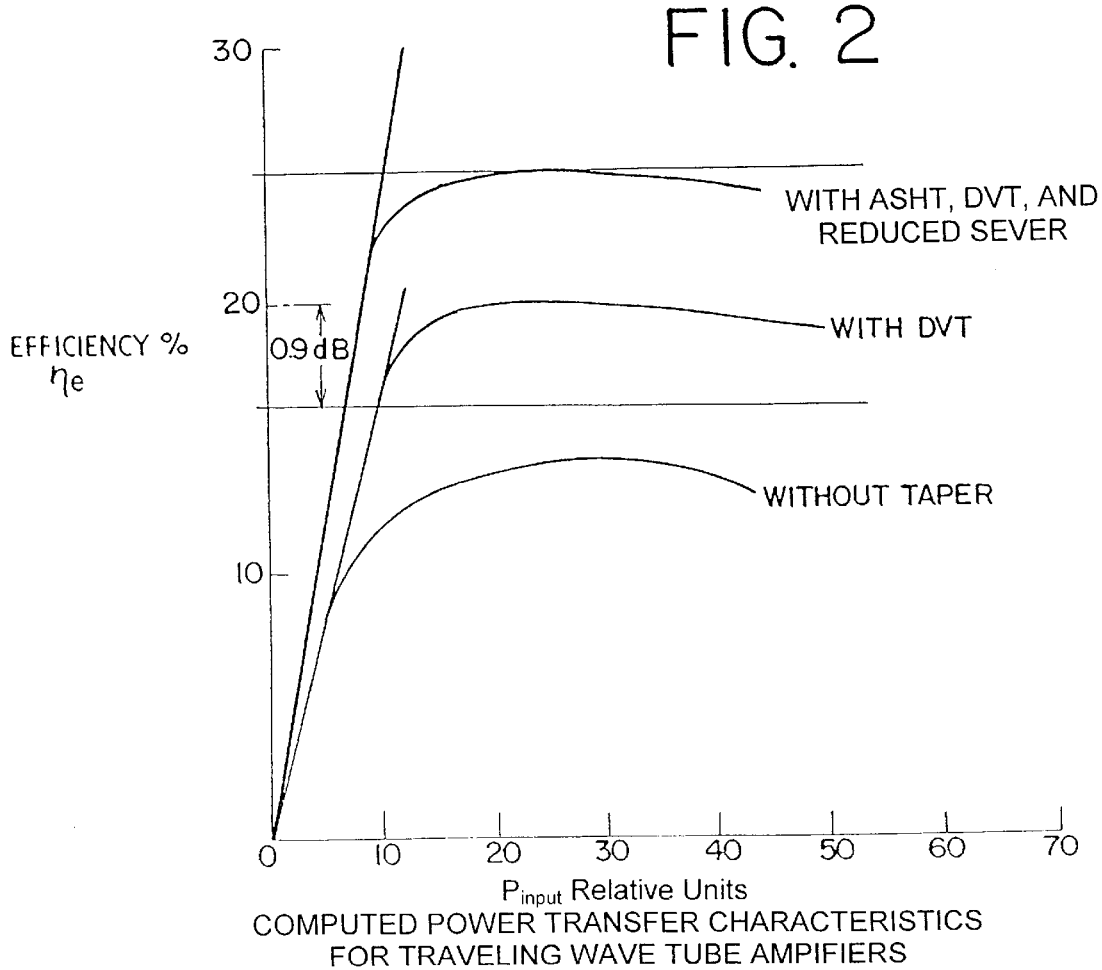
FIG. 2 is a graph of the performance of traveling wave tube amplifiers.

FIG. 2 is a graph of the gain characteristics of traveling wave tubes. As energy is extracted from the electron beam to amplify the RF signal, the beam slows down. A conventional tube has low electronic efficiency, $\eta_e$. A tube having a helical conductor with a dynamic velocity taper (DVT) shows an improvement by its higher electronic efficiency. A traveling wave tube of the present invention, with an improved sever, shows a steeper slope on such a graph, indicating its effectiveness at low power inputs, as well as significant improvements over tubes of conventional design.

Figure 3:
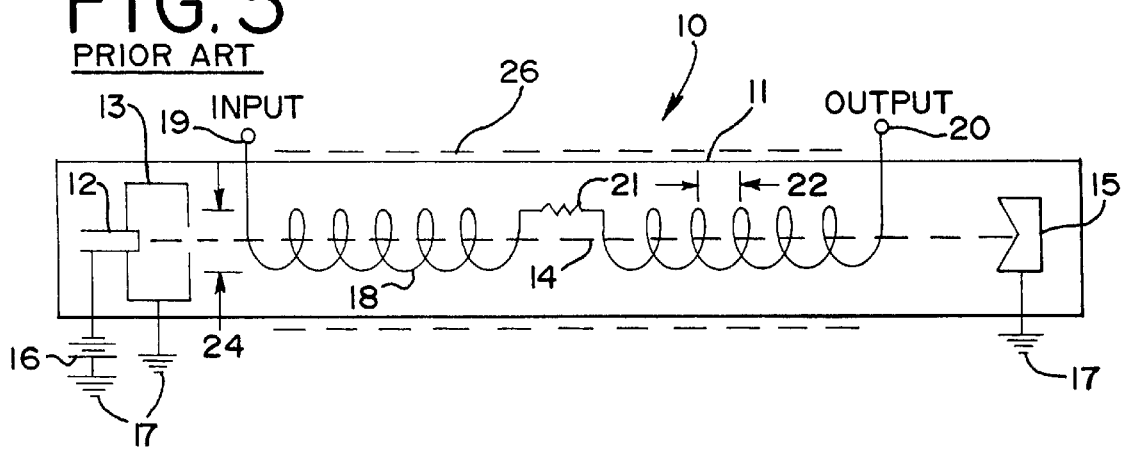
FIG. 3 is a side view of a conventional helical traveling wave tube.

FIG. 3 represents a conventional helical traveling wave tube 10, in which it is understood that the working parts of the tube are contained in a housing 11 and are in a hard vacuum, typically at least $10^{-6}$ Torr. An electron gun is present, comprising a cathode 12 connected to the negative end of a source 16 of DC power. The gun also comprises an anode 13, with both the anode and the positive of the power source connected to ground 17. A beam of electrons 14 from the gun is accelerated from the cathode to the anode, down the length of the helical conductor 18 and is received by a collector 15, also grounded. An RF signal is input through an input connector 19, propagates along the helix, and exits at an output connector 20. A sever 21 is represented electrically as a resistance in the helical conductor. The pitch 22 may be constant through the windings of the helix, as is the diameter 24 of the helix. Magnets 26 focus the beam of electrons as they traverse the tube.

Figure 4:
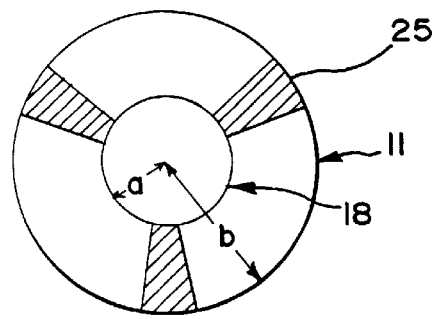
FIG. 4 is a cross section of a conventional helical traveling wave tube.

FIG. 4 shows a cross-section of a conventional helical traveling wave tube, in which the helix 18 has one or more support rods 25 interposed between the helix and the outer shell or housing 11. These rods may extend for the length of the helical conductor, in order to support the helical conductor. In addition to mechanical support, these rods may provide the principal means of heat transfer between the helix and the housing, and from the housing to the external environment of the traveling wave tube. Typically, helix temperatures are in the range of 200–400° C. This temperature is below that required for effective radiative heat transfer, and in the vacuum of the tube there can be no convection. Thus, the rods provide the only heat transfer possible from the heat-generating helix, i.e., the conduction of heat between the helix and the housing, which is the interface between the traveling wave tube and the outside environment.

The support rods may be of any convenient geometry. In one embodiment, they may be trapezoidal in cross-section. They may also be rectangular, or rounded trapezoidal or rounded rectangular in cross-section. The rods provide heat transfer between the helical conductor and the outer housing, and along with the sever, they also provide for a relatively high impedance electrical path. As will be recognized by those skilled in the art, the housing serving as both an electrical and a heat sink is kept at ground potential.

As discussed above, further improvements may also be made to the helical tube structure. Another embodiment of the sever invention includes a housing structure adapted to transport heat away from the helix and to the heat sink of the outside environment. Since many traveling wave tubes operate in communications satellites in space, the outside environment may indeed present such opportunities. As shown previously in FIG. 4, the housing 11 is typically concentric with the helix 18, often with supporting rods 25 that ensure structural integrity and also furnish a conductive heat path. The limit on such heat transfer is the length and cross-section of the path from the outside of the helix to the housing, or in FIG. 4, b-a. It is clear that heat transfer could be improved if the path could be shortened and widened, or if the material used in the support rods could be made more thermally conductive. Because of electromagnetic effects, however, the housing must be maintained at an effective distance from the helix. A housing that approaches the helical coil too closely may lower the impedance of the coil and adversely affect its performance.

Figure 5:
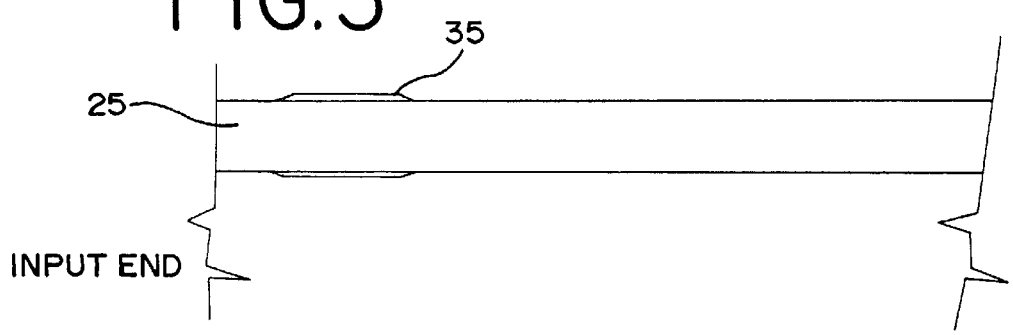
FIG. 5 is a side view of a dielectric rod with a sever according to the present invention.
Figure 6:
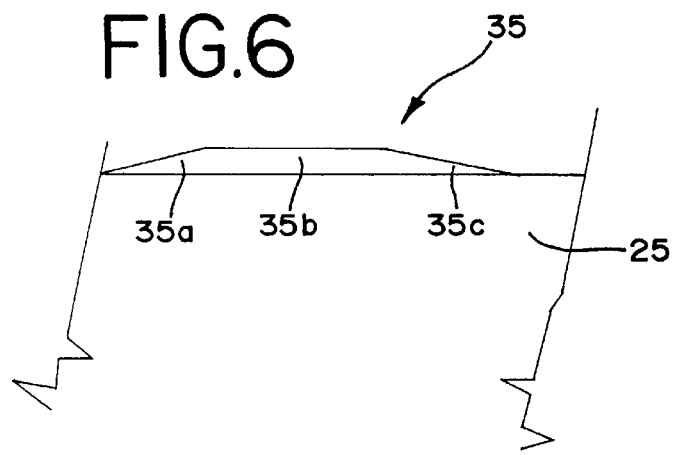
FIG. 6 is a side view of a dielectric rod with a tapered sever.

One embodiment of the invention is depicted in the longitudinal cross section of FIG. 5, in which a dielectric support rod 25 has a sever 35 applied toward an input end. FIG. 6 depicts a closer view of a longitudinal cross section of a preferred embodiment, in which rod 25 has a sever 35 applied, depicting the sever in three parts. An input section 35a and an output section 35c are tapered as shown, while the center section 35b has relatively constant thickness. The sever material is applied in a circumferential manner on the outside of one of more dielectric rods. The dielectric rods then fit axially between the helical conductor and the housing, along the length of the helical conductor.

In the embodiments of FIGS. 5 and 6, the impedance of the sever may be more easily controlled and adjusted, by feathering the edges or otherwise controlling the cross-section, thickness, and area of interface between the support rod and the sever. The taper need only be sufficiently gradual and gentle so as to avoid undesirable backward reflections of RF power. The extent to which reflections are avoided may be measured by a voltage standing wave ratio (VSWR), which compares the input waves versus the backward reflected waves from a sever. The backward reflected waves are preferably minimized for better amplifier performance.

Both FIGS. 5 and 6 are shown in greatly exaggerated form, because a sever is typically only a few millionths of a meter thick at its thickest point. The axial length of the sever is about 0.5 cm. to about 4.5 cm. long, and preferably about 1.5 cm. to about 3 cm. long. The sever is placed at a point where the amplification of the traveling wave tube is about 20 dB. This place will be downstream of the input section of the helical conductor, downstream of the ASHT, and toward the middle portion of the helical conductor.

While the sever is shown tapered in its input and output sections, what is tapered is the electrical conductivity of the sever, rather than any particular need to physically taper the sever thickness itself. The sever should have an exponentially increasing input portion, followed by a portion of constant thickness, followed by an exponentially decreasing portion, all measured from an input end of the helical conductor to the output end of the helical conductor. While other gradations in sever conductivity will produce a desirable effect, an exponentially increasing and then decreasing gradation is a preferred embodiment.

Figure 8:
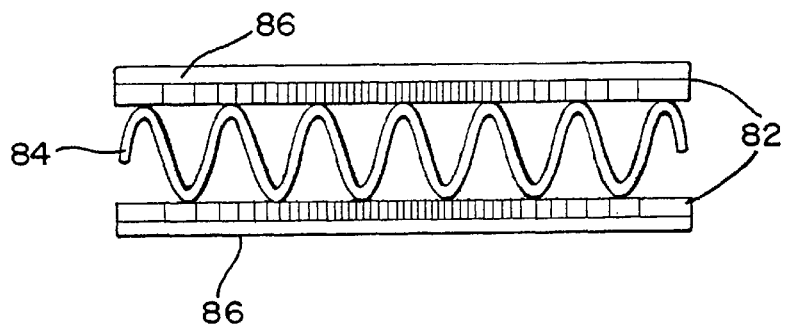
FIG. 8 is a cross section of another embodiment of a tapered sever.

The taper may be achieved in several ways, including varying the thickness or the density of the conductive or lossy material. A tapered sever may also be achieved by gradually increasing the density of the lossy or conductive material with the least conductive portions at the edges of the sever and the most conductive portions at the center. FIG. 8 is a cross-sectional view of a one embodiment of a sever 82, with density variations shown as darker or lighter shading, sandwiched between a helical conductor 84 and dielectric support rods 86. The darker or most dense portion of the sever is at its center, while the portions further away are less dense. This geometry leads to the performance described below in FIG. 9.

All that is required of a sever material is a moderate ability to conduct electricity. The conductive material is of necessity a non-ferromagnetic material, since the helical conductor and the electron beam normally operate within a magnetic field that focuses the electron beam. Materials that have been found suitable include Aquadag® colloidal dispersion of graphite in water, available from the Acheson Colloids Co., Port Huron, Mich. The dispersion is applied to one or more dielectric rods and dried. The sever may also be made from non-ferrous metals, such as titanium or zirconium.

The material may be deposited on the dielectric rods in any number of convenient ways. Aquadag® may be painted onto the dielectric rods, or it may be sprayed on and then dried. In one embodiment, the conductivity of the sever made from Aquadag® is varied by applying a gradually increasing amount, followed by a section with a constant amount, followed by a gradually decreasing amount, along the length of at least one dielectric rod. Metallic vapor may be condensed on the rods, and under the proper circumstances, metals may be plated onto the rods in a very controlled fashion.

Other ways may include a variety of deposition techniques, such as D-gun deposits of very small amounts of material in a process available from Union Carbide Corp., now a subsidiary of the duPont Co. The surface of the dielectric rod may be doped so as to provide a conductive path on the surface of the dielectric rod. Doping may take place via techniques used in the semiconductor industry, including, but not limited to, molecular beam epitaxy, ion implantation, thermal diffusion, and sputtering. Electrostatic deposition may also be used for depositing small amounts of material on dielectric rods as a sever. Normally, electrostatic deposition is more applicable to conductive substrates, but in this instance the process calls for very small, controlled amounts of material to be deposited.

In one embodiment of the invention, as depicted in FIG. 7, the housing structure 11 is still concentric with the helix 18, but is now ovate or elliptical in cross-section, rather than circular. This has the effect of bringing at least a portion of the housing closer to the helix, shortening the thermal path as well as the electrical path, and increasing the heat transferred from the helix to the housing. By bringing only a portion of the housing closer to the helix, the performance of the helix is not adversely affected. It is not necessary that the ellipse be as pronounced as shown in FIG. 7. Ratios of major radius c to minor radius d may be as little as 1.05, preferably 1.10, and more preferably 1.15, to have an appreciable effect on heat transfer. The rods are desirably constructed of materials having high thermal conductivity, low electrical conductivity, and low dielectric constant. Materials that may be used include, but are not limited to, aluminum oxide, beryllium oxide, boron nitride, diamond, and silicon nitride.

In a preferred embodiment, the minor radius d in FIG. 7 is shortened to the point that the distance d-a is about half the distance b-a of FIG. 4. An example of a preferred embodiment of this geometry, useful at 32 GHz, is one in which the helical radius is 0.012 inches (0.030 cm), with a major elliptical radius of 0.030 inches (0.075 cm) and a minor elliptical radius of 0.018 inches (0.045 cm), that is, the ratios of the diameters, or the radii, is 1.0:1.5:2.5, for the basic helix radius, to the minor elliptical axis, to the major elliptical axis. It is not necessary for the housing to have the shape of a perfect ellipse. Any shape that shortens the thermal path from the helix to the housing will suffice, although housing shapes that are symmetrical and uniform are preferred. They are preferred for ease of manufacture of the housing, ease of manufacture of the support/heat transfer rods, and for symmetry of effects on the magnetic field. In another embodiment of the invention, the heat transferred from the helix has the desirable effect of lowering the temperature of the helix, in some calculations from 300° C. to 150° C. In accordance with well-known laws that relate resistance of a coil to its temperature, the skin effect losses of the helix will fall by as much as 20%.

In one embodiment of the invention, a helical tube is designed with a copper housing and anisotropic pyrolytic boron nitride (APBN) rods to provide the support and heat transfer from the helix to the copper housing. The helix, about 8 cm long, has a base radius of 0.030 cm and a pitch of 0.030 cm. A tapered section of five turns with an increase in both pitch and radius of 5% begins at about the 3 cm point, and is about 0.15 cm long. A dielectric rod of boron nitride is fitted between the helix and the copper housing. The rod has a sever formed by applying Aquadag®. The sever is about 1–5 cm. in length, preferably about 3 cm., and is about 0.000005 m. thick (0.0002 in.) in its center. The sever constitutes a band towards the end of the rod to be used for the input end of the helix. In this configuration, there is a path of high resistance between the helix and the housing when the boron rod and its sever are in intimate contact between the helical conductor and the housing.

Figure 9:
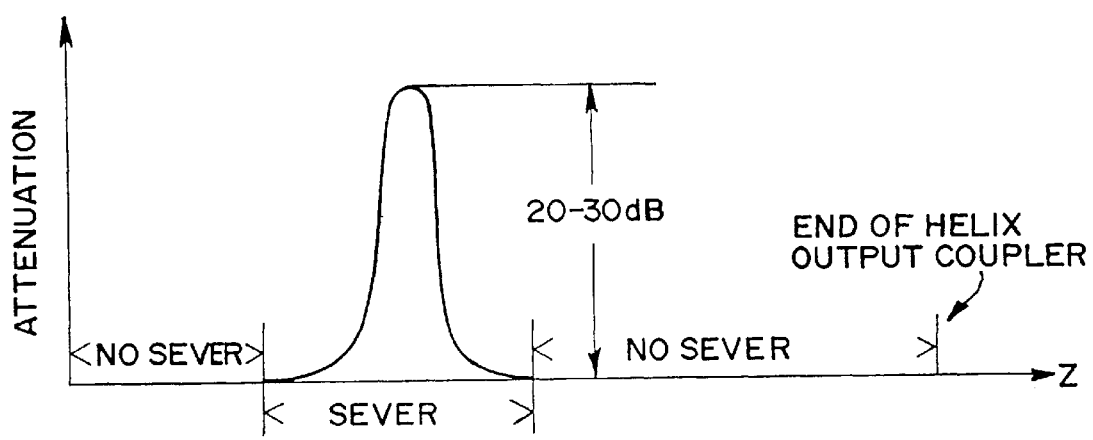
FIG. 9 is a graphical depiction of the performance of a sever according to the present invention.

FIG. 9 is a graph illustrating the performance of an amplifier using the improved sever. The attenuation is that measured of a desired RF signal applied to the input of an amplifier. The attenuation is from 1 to 30 dB, and preferably, as shown in FIG. 9, 20–30 dB. In another embodiment, the attenuation is 10–20 dB. The attenuation is due to the bleed-off from the sever. The sever may be fine-tuned for the frequency and application sought for the amplifier, typically in the range of 1–50 GHz. However, the amplifier and the sever may be designed and fitted for particular desired frequencies, such as 4.0 GHz, 12.0 GHz or a range, such as 26–40 GHz.

In one embodiment of the invention, the sever is applied and a test is performed to measure attenuation. The sever conductance may be trimmed (less conductive material) if the attenuation is too great. The sever conductance may be increased by adding more material if the attenuation is too little. The sever may thus be adjusted for a desired frequency or range of frequencies. The sever is desirably applied in a tapered fashion, with a center section and an input and an output section, feathered towards their outer edges as shown in FIGS. 6 and 8. What is desired is a sever with a gradual, exponentially increasing electrical contact, a constant section, and then an exponentially decreasing electrical contact in the opposite direction, thus minimizing reflection losses.

FIG. 10 illustrates another embodiment of the invention, in which the main portion of the helix is of constant pitch and radius, and the ASHT, on the input section of the helix, has decreasing pitch and radius. FIG. 11 illustrates a preferred embodiment of the invention, in a design similar to that of FIG. 10, with an ASHT of increasing pitch and radius on the input side of the helix, and a dynamic velocity taper on the output side. In both figures, dielectric support rods are fitted between the outside of the helical conductor and the inside of the housing, with an improved sever as discussed above. In both cases, the ASHT minimizes the content of parasitic space harmonics, while the amplifier works at a frequency well below the π-point of the backward wave oscillations. The lower the content of parasitic space harmonics, the less a sever is needed in the amplifier.

It is thus seen that the performance of the amplifiers is frequencydependent. In one way of practicing the invention, a traveling wave tube amplifier is designed and constructed, and a sever is applied to at least one dielectric rod. The performance of the tube is tested, as described and as shown in FIG. 9, and the sever is adjusted for amplifier performance in the desired range. The use of an ASHT is preferred, as is the use of an ASHT and a DVT in the helical conductor.

In both FIGS. 10 and 11, a helical traveling wave tube 10 comprises a housing 11, and a helical structure 18 with an RF input 19 and an output 20. A cathode 12 emits a beam of electrons 14 through the center of the helical structure, accelerated by a grounded 17 anode 13 and collected by a collector 15, also grounded 17. Both FIGS. 10 and 11 include an ASHT near the RF input. In FIG. 10, the ASHT begins with a larger pitch 22*a* and radius 24*a*, decreasing both over three to five turns until they equal the pitch 22*b* and radius 24*b* of the middle portion of the helix.

In FIG. 11, the helix pitch 22*a* and radius 24*a* of input section 18*a* are smaller than that of the middle portion 18, and they become larger over a few turns until they also match the pitch 22*b* and radius 24*b* of the middle portion of the helix. The helical structure of FIG. 10 also includes a dynamic velocity taper 28 near the output section 20. Both FIGS. 10 and 11 also use magnets 26 to focus the beam of electrons as it traverses from cathode 12 to collector 15. The dielectric rods and severs are omitted for clarity in FIGS. 10 and 11.

Other materials may be used for the sever. Any material providing controllable electrical contact between the helical conductor and the housing may be used. Thus, in another embodiment, metal vapor is plated or deposited onto the dielectric rod to serve as a sever. One embodiment features titanium metal heated in a chamber and deposited onto a cold dielectric rod, preferably masked in order to control the areas of deposition. Metals with a high vapor pressure, such as silver or lead, should be avoided, as should any ferromagnetic material, while stable compounds, metals and alloys with intermediate conductivity are favored, including titanium, zirconium, and graphite.

While this invention has been shown and described in connection with the preferred embodiments, it is apparent that certain changes and modifications, in addition to those mentioned above, may be made from the basic features of this invention. For example, the invention has been described as a conductive coating or surface on the dielectric rods. It would be possible to use a very thin foil or foil-like material rather than a conductive surface or coating. However, the foil would constitute an extra part that must be manufactured, handled and assembled. In addition, foil with thickness of the order of 0.000005 to 0.000010 of a meter would be very difficult to handle. If the foil was made without a taper, it would likely reflect input signals to a great extent.

There are also other ways to practice the invention. For example, wire of tungsten-rhenium composition is desirably used to wind the helix, but other wire may be used without departing from the invention. Housings are desirably made of copper or other conductive material, but may alternately be made from other materials, so long as the property of thermal conductivity is maintained. The sever is preferably placed in an input section to the helical winding, downstream of an input section with an ASHT and with a dynamic velocity taper near the RF output of the helical winding. Accordingly, it is the intention of the applicants to protect all variations and modifications within the valid scope of the present invention. It is intended that the invention be defined by the following claims, including all equivalents.

I claim:

1. A helical traveling wave tube for amplifying an RF signal, comprising:

a traveling wave tube, having a cathode, an anode and a collector, operably connected to induce a beam of electrons to flow between the anode and the cathode, and wherein the collector receives the beam of electrons;

a helical conductor section between the cathode and the collector, said helical conductor section having an RF input, an input section, a middle section, an output section, and an RF output, and wherein the input section has an adverse space harmonics taper (ASHT), wherein a pitch and radius of the input section vary linearly in the direction of propagation of the helical conductor;

a housing containing the traveling tube and the helical conductor section;

at least one dielectric supporting rod between the helical conductor and the housing, said at least one rod along at least a portion of the length of the helical conductor; and a sever, comprising a conductive surface on said at least one dielectric rod, such that the attenuation of an RF signal ranges from about 1 db to about 30 db.

2. The traveling wave tube of claim 1, wherein the sever comprises a coating selected from the group consisting of graphite, titanium, zirconium, and non-ferromagnetic conductive materials.

3. The traveling wave tube of claim 1, wherein the conductive surface comprises ions implanted by at least one of molecular beam epitaxy, ion implantation, thermal diffusion, and sputtering.

4. The traveling wave tube of claim 1, wherein the conductive surface comprises a conductive foil.

5. The traveling wave tube of claim 1, wherein the sever is about 0.5 to about 4.5 cm long, preferably about 1.5 cm. to about 3 cm. long.

6. The traveling wave tube of claim 1, wherein the attenuation is from about 10 dB to about 20 dB.

7. The traveling wave tube of claim 1, wherein the dielectric rod is selected from the group consisting of beryllium oxide, silicon nitride, boron nitride, and diamond.

8. The helical traveling wave tube of claim 1, wherein the ASHT increases in both pitch and radius 0.5 to 25%.

9. The helical traveling wave tube of claim 8, wherein the ASHT increases both pitch and radius 2 to 10%.

10. The helical traveling wave tube of claim 2, wherein the ASHT decreases both pitch and radius 0.5 to 25%.

11. The helical traveling wave tube of claim 8, wherein the ASHT decreases both pitch and radius 2 to 10%.

12. The helical traveling wave tube of claim 1, wherein the input section comprises at least three turns of the helical conductor.

13. The helical traveling wave tube of claim 1, wherein the housing comprises an ellipse, with a major diameter at least 1.05 times the minor diameter, and a support structure comprises dielectric rods having high thermal conductivity, low electrical conductivity and a low dielectric constant.

14. The helical traveling wave tube of claim 13, wherein the support structure further comprises rods made from material selected from the group consisting of beryllium oxide, aluminum oxide, silicon nitride, boron nitride and diamond.

15. The helical traveling wave tube of claim 1, wherein the helical conductor output section further comprises a dynamic velocity taper, in which the helical conductor has a constant radius and an exponentially varying pitch.

16. The helical traveling wave tube of claim 1, wherein the helical conductor further comprises wire made of tungsten or tungsten alloys, and the wire cross-section is in a shape selected from the group consisting of a ribbon, a rounded rectangle, an ellipse, an oval and a circle.

17. The helical traveling wave tube of claim 1, wherein the RF signal is from 1 to 50 GHz.

18. A helical traveling wave tube for amplifying an RF signal, comprising:
   a traveling wave tube, having a cathode, an anode and a collector, operably connected to induce a beam of electrons to flow between the anode and the cathode, and wherein the collector receives the beam of electrons;
   a helical conductor section between the cathode and the anode, said helical conductor section having an RF input, an input section, a middle section, an output section, and an RF output, wherein the input section has an adverse space harmonics taper (ASHT), wherein a pitch and radius of the input section vary simultaneously in the direction of propagation of the helical conductor;
   a housing containing the traveling tube and the helical conductor;
   at least one dielectric supporting rod between the helical conductor and the housing, said at least one rod along at least a portion of the length of the helical conductor; and
   a sever, comprising a conductive surface on said at least one dielectric rod, such that the attention of an RF signal ranges from about 1 dB to about 30 db,
   wherein the pitch and the radius of the input section vary linearly according to the function $$\frac{p(z)}{a(z)} = \frac{p_0}{a_0},$$

where p(z) is a pitch of the input section, which varies linearly in the direction of propagation of the helical conductor, the z-axis; $p_0$ is a pitch of the middle section; a(z) is a radius of the input section, which varies linearly in the direction of propagation of the helical conductor, the z-axis; and $a_0$ is a radius of the middle section.

19. The helical traveling wave tube of claim 18, wherein the attenuation is from about 10 dB to about 20 dB.

20. The helical conductor of claim 18, wherein the ASHT increases in both pitch and radius 0.5 to 25% over the length of the input section.

21. The helical conductor of claim 18, wherein the ASHT increases in both pitch and radius 2% to 10% over the length of the input section.

22. The helical conductor of claim 18, wherein the ASHT decreases in both pitch and radius 0.5 to 25% over the length of the input section.

23. The helical conductor of claim 18, wherein the ASHT decreases in both pitch and radius 2% to 10% over the length of the input section.

24. The helical conductor of claim 18, wherein the input section comprises at least three turns of the helical conductor.

25. The traveling wave tube of claim 18, wherein the sever comprises a coating selected from the group consisting of graphite, deposited metallic vapor, deposited intermetallic vapor, and conductive materials.

26. The traveling wave tube of claim 18, wherein the conductive surface comprises ions implanted by at least one of molecular beam epitaxy, ion implantation, thermal diffusion, and sputtering.

27. The traveling wave tube of claim 18, where the conductive surface comprises a conductive foil.

28. The traveling wave tube of claim 18, wherein the at least one dielectric rod is made from material selected from the group consisting of beryllium oxide, aluminum oxide, silicon nitride, boron nitride, and diamond.

29. The traveling wave tube of claim 18, wherein the output section further comprises a dynamic velocity taper.

30. The traveling wave tube of claim 18 wherein the housing comprises an ellipse with a major diameter at least 1.05 times the minor diameter of the ellipse, and the support structure comprises dielectric rods having high thermal conductivity, low electrical conductivity and a low dielectric constant.

31. The traveling wave tube of claim 18, wherein a support structure further comprises rods made from material selected from the group consisting of beryllium oxide, aluminum oxide, silicon nitride, boron nitride and diamond.

32. A method of manufacturing a sever on a dielectric rod, comprising:
   providing a dielectric rod; and
   depositing a sever in the form of a conductive material on the surface of the rod, said sever having a start section, a middle section, and a finish section;
   testing the sever in a traveling wave tube amplifier for RF attenuation of 1 to 30 dB, wherein the traveling wave tube amplifier has a helical conductor with an input section having an adverse space harmonics taper, and wherein a pitch and a radius of the input section vary linearly in a direction of propagation of the helical conductor; and adjusting the sever according to the results of the testing.

33. The method of claim 32 further comprising a step of tapering the sever at said start and said finish sections.

34. The method of claim 32 wherein the testing is for attenuation between 10 to 20 dB and the adjusting is done according to the results of the testing.

35. The method of claim 32 wherein the depositing is accomplished by a method selected from the group consisting of plating, painting, depositing, condensing, electrostatic depositing, and spraying.

36. The method of claim 32, wherein the depositing accomplished by a method selected from the group consisting of molecular beam epitaxy, ion implantation, thermal diffusion, and sputtering.

37. The method of claim 32, where the sever is made from material selected from the group consisting of graphite, titanium, zirconium and nonferromagnetic conductive materials.

* * * * *